(12) United States Patent
Houle

(10) Patent No.: US 7,190,585 B2
(45) Date of Patent: Mar. 13, 2007

(54) THERMAL HEAT SPREADERS DESIGNED FOR LOWER COST MANUFACTURABILITY, LOWER MASS AND INCREASED THERMAL PERFORMANCE

(75) Inventor: Sabina J. Houle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/613,418

(22) Filed: Jul. 3, 2003

(65) Prior Publication Data

US 2004/0095727 A1   May 20, 2004

Related U.S. Application Data

(62) Division of application No. 09/675,316, filed on Sep. 29, 2000, now abandoned.

(51) Int. Cl.
*H05K 7/20* (2006.01)
*H01L 23/34* (2006.01)

(52) U.S. Cl. ............... 361/704; 257/706; 257/712; 257/713; 361/708; 361/710

(58) Field of Classification Search ........... 165/80.2, 165/80.3, 185; 174/16.3; 257/706–707, 257/712–713; 361/704–710, 719, 720
See application file for complete search history.

(56) References Cited

U.S. PATENT DOCUMENTS

| | | | | |
|---|---|---|---|---|
| 5,175,613 | A | * 12/1992 | Barker et al. | ............... 257/713 |
| 5,410,451 | A | 4/1995 | Hawthorne et al. | |
| 5,578,788 | A | * 11/1996 | Engsbr.ang.ten | ............ 361/705 |
| 5,621,615 | A | 4/1997 | Dawson et al. | |
| 5,898,571 | A | 4/1999 | Mertol | |
| 5,931,222 | A | * 8/1999 | Toy et al. | ................. 165/80.3 |
| 5,998,241 | A | 12/1999 | Niwa | |
| 6,008,536 | A | 12/1999 | Mertol | |
| 6,091,603 | A | * 7/2000 | Daves et al. | ................. 361/704 |
| 6,118,177 | A | 9/2000 | Lischner et al. | |
| 6,218,730 | B1 | 4/2001 | Toy et al. | |
| 6,252,776 | B1 | * 6/2001 | Saito et al. | ................. 361/719 |
| 6,281,573 | B1 | 8/2001 | Atwood et al. | |
| 2002/0012231 | A1 | 1/2002 | Bhatia et al. | |

* cited by examiner

*Primary Examiner*—Gregory Thompson
(74) *Attorney, Agent, or Firm*—Blakely, Sokoloff, Taylor & Zafman LLP

(57) ABSTRACT

A heat spreader, comprising a metal body with attached standoffs located approximately above the integrated circuit, is described. The standoffs should improve bond layer thickness control between the integrated circuit and the heat spreader, leading to a lower cost and lower mass package, as well as a more reliable device with increased thermal performance.

7 Claims, 11 Drawing Sheets

(Prior Art)

(Prior Art)

THERMAL HEAT SPREADERS DESIGNED FOR LOWER COST MANUFACTURABILITY, LOWER MASS AND INCREASED THERMAL PERFORMANCE

CROSS-REFERENCE TO RELATED APPLICATIONS

The present patent application is a divisional of prior application Ser. No. 09/675,316, filed Sep. 29, 2000, now abandonded entitled "THERMAL HEAT SPREADERS DESIGNED FOR LOWER COST MANUFACTURABILITY, LOWER MASS AND INCREASED THERMAL PERFORMANCE."

BACKGROUND

1. Field of the Invention

This invention relates to semiconductor manufacturing technology generally, and more specifically, to heat spreader technology for heat dissipation in a semiconductor package.

2. Description of the Related Art

There is a trend toward increasing the number of functions built into a given integrated circuit (also referred to as a device.) This results in an increased density of circuits in the device. Along with the increased circuit density, there is always a desire to increase the data processing speed; therefore, the clock speed of the device is increased as well. As the density of circuits and the clock speed increase, the amount of heat generated will increase. Unfortunately, device reliability and performance will decrease as the amount of heat that the device is exposed to increases. Therefore, it is critical that there be an efficient heat-removal system associated with integrated circuits.

FIG. 1 illustrates a typical integrated circuit and associated packaging. There are a number of methods for removing heat from integrated circuits 103, including active methods, such as fans or recirculated coolants (not shown), or passive methods, such as heat sinks 106 and heat spreaders 105. Because of decreasing device 103 size, there is usually a need to evenly distribute heat generated by the small device 103 to the larger heat sink 107 to eliminate "hot spots." This is the function of heat spreaders 105. Heat spreaders 105 are coupled to the integrated circuit through the use of a thermally conductive material 104. These thermal interface materials 104, such as gel or grease containing metal particles to improve heat conduction, are applied in between the device 103 and the heat spreading structure 105 to improve the heat transfer from the integrated circuit 103 to the heat spreader 105. Typically, the heat spreading structure 105 will be constructed either of a ceramic material or a metal, such as aluminum or copper. Aluminum is preferred from a cost standpoint, as it is easy and cheap to manufacture; however, as the heat load that needs to be transferred increases, copper becomes the metal of choice because of its superior heat transfer characteristics. There will typically be a contiguous wall 106 around the edge of the heat spreader, which serves as a point of attachment and support between the substrate 101 and the spreader 105. The contiguous wall 106 completely surrounds the area containing the device, forming an enclosed cavity on top of the substrate 101. There is often a heat sink 107 attached to the heat spreader 105 using a thermal interface material 108, to allow for the greater cooling capacity associated with the high-surface area of the heat sink 107.

While heat spreaders have proven to be effective in increasing heat dissipation efficiency, there are problems with the current design that lead to decreased manufacturing yields, as well as higher packaging costs. FIGS. 2a–2b illustrate these problems.

First, the contiguous wall 106a associated with the heat spreader body 105a adds little to the dissipation of heat. Its main purpose is to act as a support for the heat spreader body 105a, and as a point of attachment to the substrate 101a. This adds excess weight and cost, as well as contributes to manufacturing defects through the addition of unneeded complexity in forming the contiguous wall structure. In addition, bonding a contiguous wall structure to a substrate results in a very rigid package, which can lead to package failure when thermally stressed due to differences in the coefficient of thermal expansion (CTE) between the heat spreader and substrate materials.

Second, the bond line thickness 104a between the integrated circuit 103a and the heat spreader 105a is strongly influenced by the size of the metal particles 206a that are a constituent of the thermal interface material used to form the bond between the integrated circuit 101a and the heat spreader 105a. This works well as long as the particle size 206a is relatively uniform. However, referring to FIG. 2b, when there is a wide distribution of metal particle 206b size, a condition called "die tilting" may occur. Die tilting is caused by a relatively large particle 206b in the thermal interface material becoming wedged in between the integrated circuit 101b and the heat spreader 105b. When a clamping pressure is applied to the heat spreader 105b during the manufacturing process, the large particle 206b causes an uneven distribution of force across the face of the integrated circuit 101b, either causing the device 103b to tilt to relieve the stress, or perhaps to crack. This die tilting or cracking may lead to either poor device reliability or to complete failure.

Therefore, what is needed is a heat spreader that will meet or exceed today's heat spreading performance requirements while being both easier to manufacture and designed to better control the bond thickness between the heat spreader and the device, leading to reduced cost and better integrated circuit reliability.

BRIEF DESCRIPTION OF THE DRAWINGS

The present invention is illustrated by way of example, and not limitation, in the Figures of the accompanying drawings in which.

DETAILED DESCRIPTION

An improved apparatus for spreading heat from a packaged integrated circuit is described. In the following description, numerous specific details are set forth such as material types, dimensions, etc., in order to provide a thorough understanding of the present invention. However, it will be obvious to one of skill in the art that the invention may be practiced without these specific details. In other instances, well-known elements and processing techniques have not been shown in particular detail in order to avoid unnecessarily obscuring the present invention.

A heat spreader, comprising a metal body with attached standoffs located approximately above the integrated circuit, is described. The standoffs should improve bond layer thickness control between the integrated circuit and the heat spreader, leading to a lower cost and lower mass package, as well a more reliable device with increased thermal performance.

This discussion will mainly be limited to those needs associated with removing heat from the backside of a flip chip that is housed within pinned, SMT and INT packages. It will be recognized, however, that such focus is for descriptive purposes only and that the apparatus and methods of the present invention are applicable to other types of electronic devices and other types of packaging.

Figure 3A:
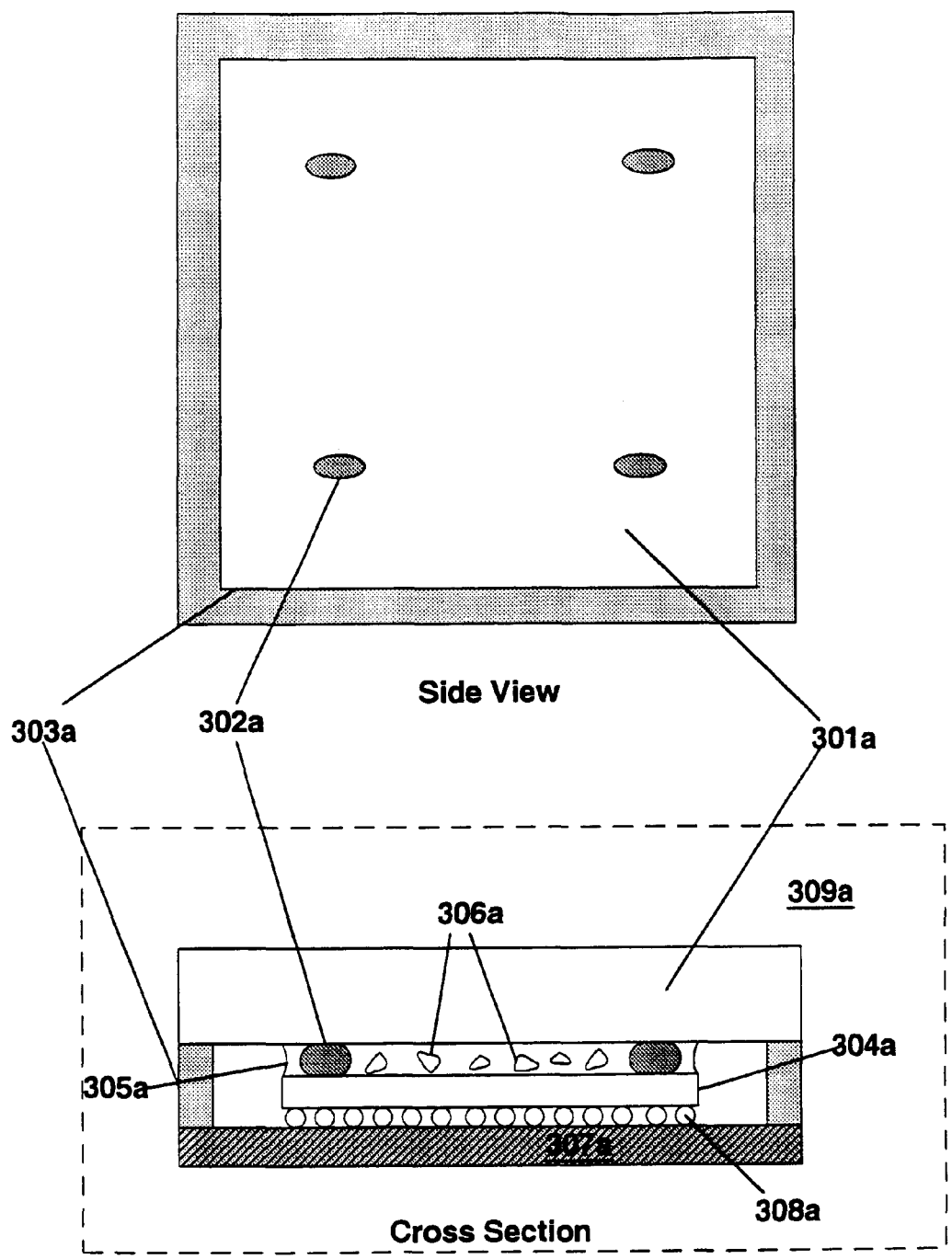
FIG. 3a shows a side view of an embodiment of a heat spreader with attached standoffs, as well as a cross-section of an integrated circuit package incorporating the heat spreader.

FIG. 3a illustrates both a device-side view of a heat spreader 301a, and a cross-section of a semiconductor package 309a in accordance with an embodiment of the present invention. The heat spreader 301a has small standoffs 302a attached to the cavity-side surface. In one embodiment, the standoffs would be approximately 100 μm high by 50 μm long by 25 μm wide. In an embodiment, there will be four standoffs. However, the number and size of the standoffs will vary from package to package, and the above dimensions and number of standoffs should be construed as limiting the size or number of standoffs which the present invention may contain.

In one embodiment, the standoffs may be stamped onto the surface of the heat spreader. However, there are a multitude of ways in which these structures may be formed, such as machining or injection molding, and in another embodiment, a different method may be used. Hence, the method mentioned in this embodiment should not be interpreted as limiting the way in which the standoffs may be formed. The standoffs should be positioned so that they will contact areas on the backside of the "flip chip" integrated circuit 304a when the package is assembled. In this embodiment, the heat spreader 301a is further constructed of copper. In another embodiment, the heat spreader 301a may be constructed of some other type of heat conducting material, such as aluminum, magnesium or ceramic.

In an embodiment, the heat spreader has a copper body plated with an oxidation-resistant metal, such as nickel. In a different embodiment, the heat spreader body may be plated with some other type of metal, or even a heat-conducting organic coating, such as thermally conductive epoxy resin. An example of an organic coating that may be used is Powercoat™, or another proprietary coating. An advantage of organic coatings could be that their physical properties may be able to be modified to maximize the strength of the substrate 307a to heat spreader 301a bond, as well as to improve thermal conduction.

The package 309a includes a substrate 307a having a semiconductor device 304a mounted on a top surface of the substrate 307a. In one embodiment, the semiconductor device is mechanically and electrically coupled to the top surface of substrate 307a via a plurality of solder bump connections 308a. The package contains at least one wiring layer (not shown) that electrically connects the device to pins located along the bottom surface of substrate 307a.

In accordance with the present invention, a heat spreader 301a is thermally coupled to the bottom of the flip chip structure 304a through a thermal interface material 305a containing metal particles 306a. In one embodiment, the thermal interface material is thermal grease. In another embodiment, the thermal interface material may be gel, or other proprietary formulation.

In this embodiment, the heat spreader 301a is attached to the substrate 307a through a contiguous wall structure 303a. In an embodiment, the contiguous wall structure will be approximately 0.63 mm tall. In another embodiment, the wall height may differ from this height substantially, so this embodiment should not be read to limit the size of the wall structure.

In the present invention, the standoffs should be larger than the largest particle size in the thermal interface material, to prevent particles from becoming wedged in between the integrated circuit 304a and the heat spreader 301a. In one embodiment, particle sizes range from 25–45 μm, less than half the height of the standoffs in the above embodiment. However, this size relationship is for illustration only, and should not be understood to limit the relative sizes of the particles and the standoffs.

Figure 2A:
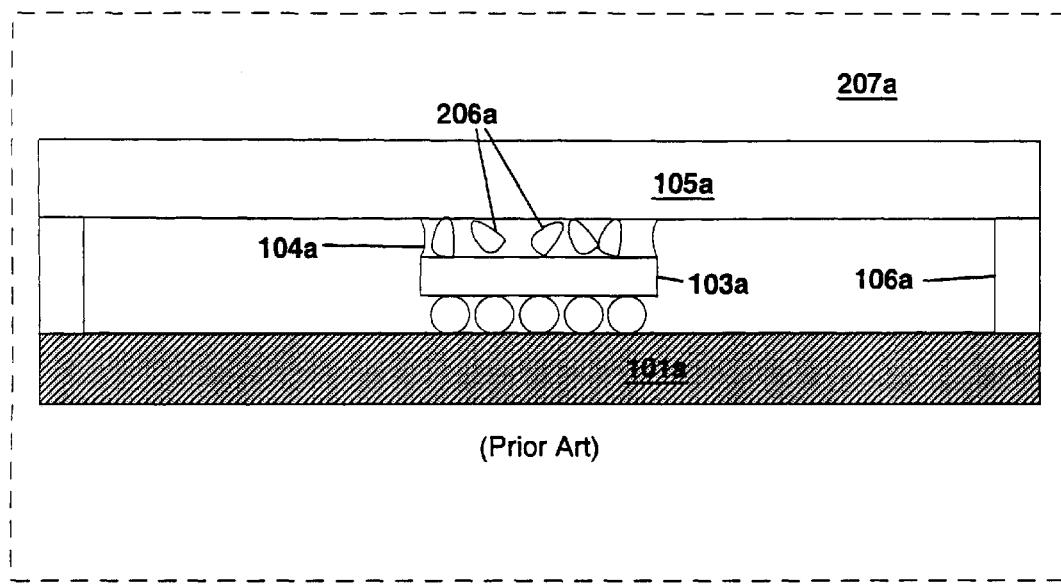
FIG. 2a shows an expanded view of a prior art integrated circuit package design.
Figure 2B:
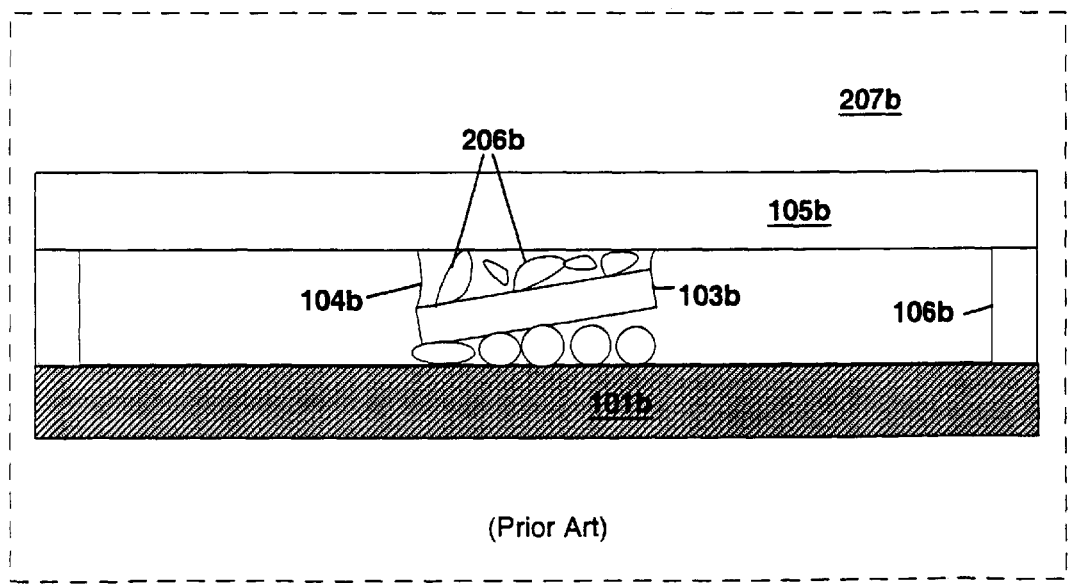
FIG. 2b shows an expanded view of a prior art integrated circuit package design exhibiting "die tilting."

In addition, the size of the standoffs should be closely matched. In an embodiment, the standoff height may be controlled within ±3 μm. The standoffs help to maintain a tight tolerance for the distance between the integrated circuit 304 and the heat spreader 301. This should eliminate the problems associated with varying bond thickness and die tilting due to particle size differences, as shown in FIG. 2b. This should lead to higher yields, which may result in a lowered cost for the package.

Figure 3B:
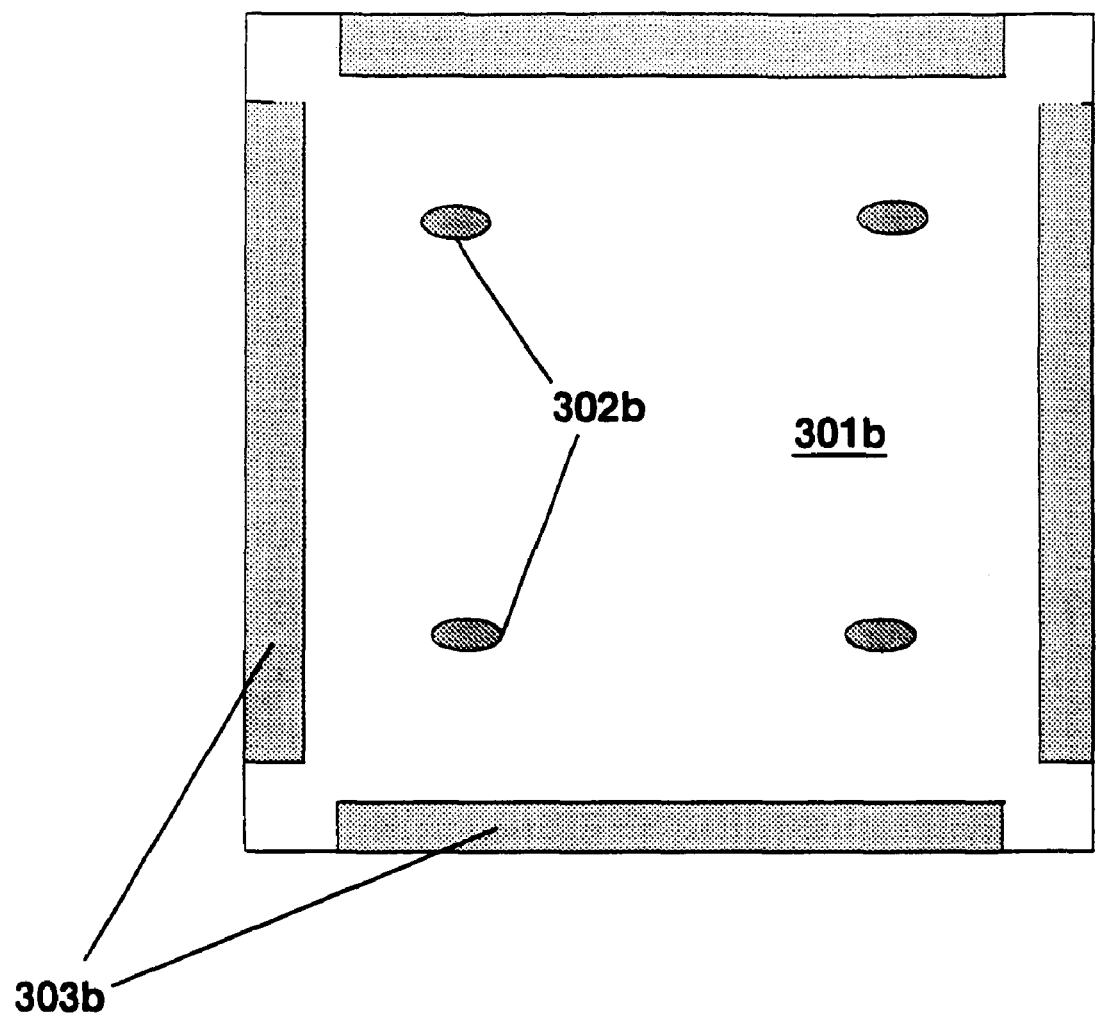
FIG. 3b shows a heat spreader with attached standoffs that uses a non-contiguous wall structure.

Note that the wall structure 303a does not have to be contiguous. FIG. 3b illustrates that it may be advantageous to form a "broken" wall 303b structure on the heat spreader body 301b. The broken wall 303b may make the overall package 308a less rigid, preventing warping of the package 308a due to CTE mismatches during thermal cycling, as well as allowing for pressure relief inside of the package.

Figure 1:
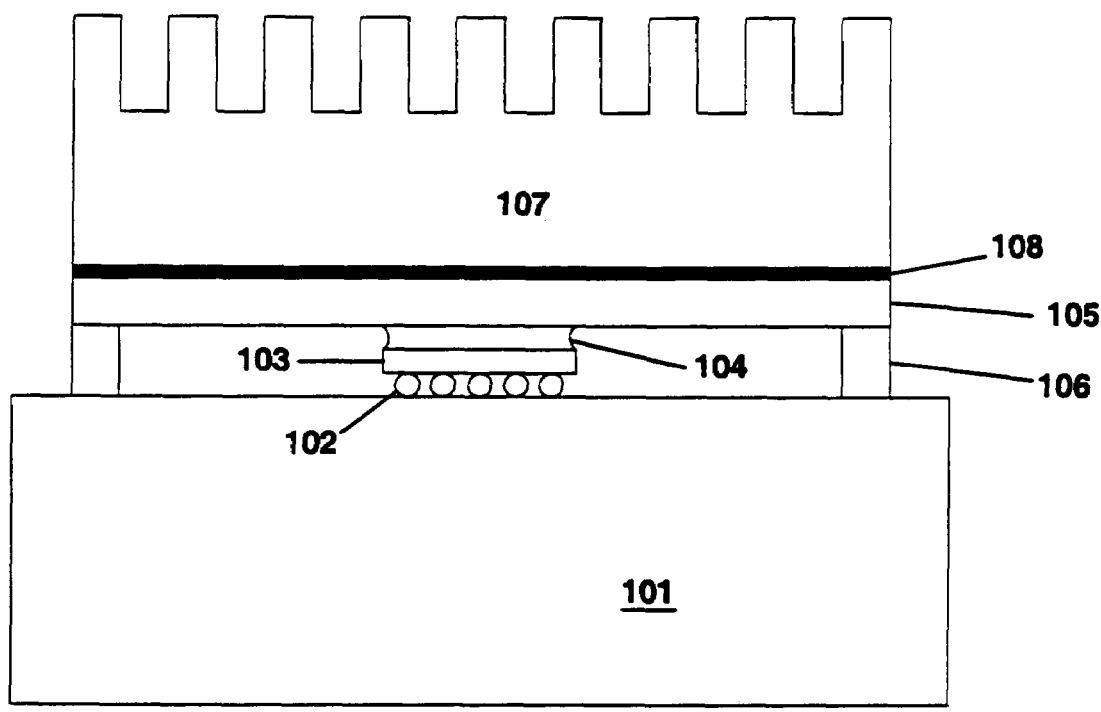
FIG. 1 shows a prior art integrated circuit package design.

Note that a heat sink (reference FIG. 1, 107) is typically attached to the heat spreader using a thermal interface material. The heat sink should allow for the more rapid dissipation of heat due to increased surface area for cooling, as discussed in the Background section above. Note that although a heat sink may or may not included in the semiconductor package under discussion, it is not expected to vary significantly from the prior art, and as such, will not be included in the following discussions. It should be understood, however, that the failure to discuss a heat sink should not be construed to imply the presence or non-presence of a heat sink as part of the above invention.

Figure 4A:
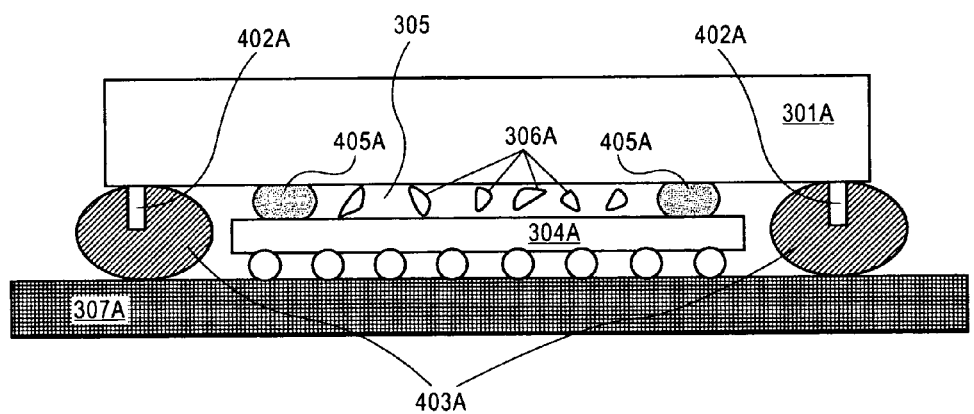
FIG. 4a shows an embodiment of a heat spreader with attached standoffs that uses a reduced-size wall structure.

FIG. 4a shows another embodiment of the present invention. Here, the contiguous wall structure 303a shown in FIG. 3 is reduced in size. In an embodiment, the reduced-size wall structure 402a will have a height of 30 mm. In a different embodiment, the wall height may be greater or less than this, or eliminated (see FIG. 6 below). The smaller wall 402a serves as a point of mechanical attachment for a flexible polymeric sealant material 403a, which bonds the heat spreader 301a to the substrate 307a. The sealant material 403a surrounds the device 304a and fills the gap between the substrate 307a and the heat spreader 301a, forming a completely enclosed cavity containing the device 304a. The use of the sealant material 403a allows for a more flexible bond between the substrate 307a and the heat spreader 301a. The flexible bond may help to compensate for differing coefficients of thermal expansion (CTE) between the heat spreader and the substrate, resulting in a more consistent heat conduction pathway. A second advantage of the current embodiment is that the sealant/reduced size wall combination is much lighter in weight as compared to the prior art wall design, resulting in a lighter package. An example of a sealant material 403a that could be used is silicone or another proprietary sealant formulation. Additionally, the embodiment shown in FIG. 4a further includes stand-offs 405a attached to a bottom surface of heat spreader 301a and in contact with device 304a. Standoffs 405a should improve bond layer thickness control between device 304a and heat spreader 301a, leading to a lower cost and a lower mass package, as well a more reliable device with increased thermal performance. Interdisposed between heat spreader 301a and device 304a are metal particles 306a within a thermal interface material 305a.

Figure 4B:
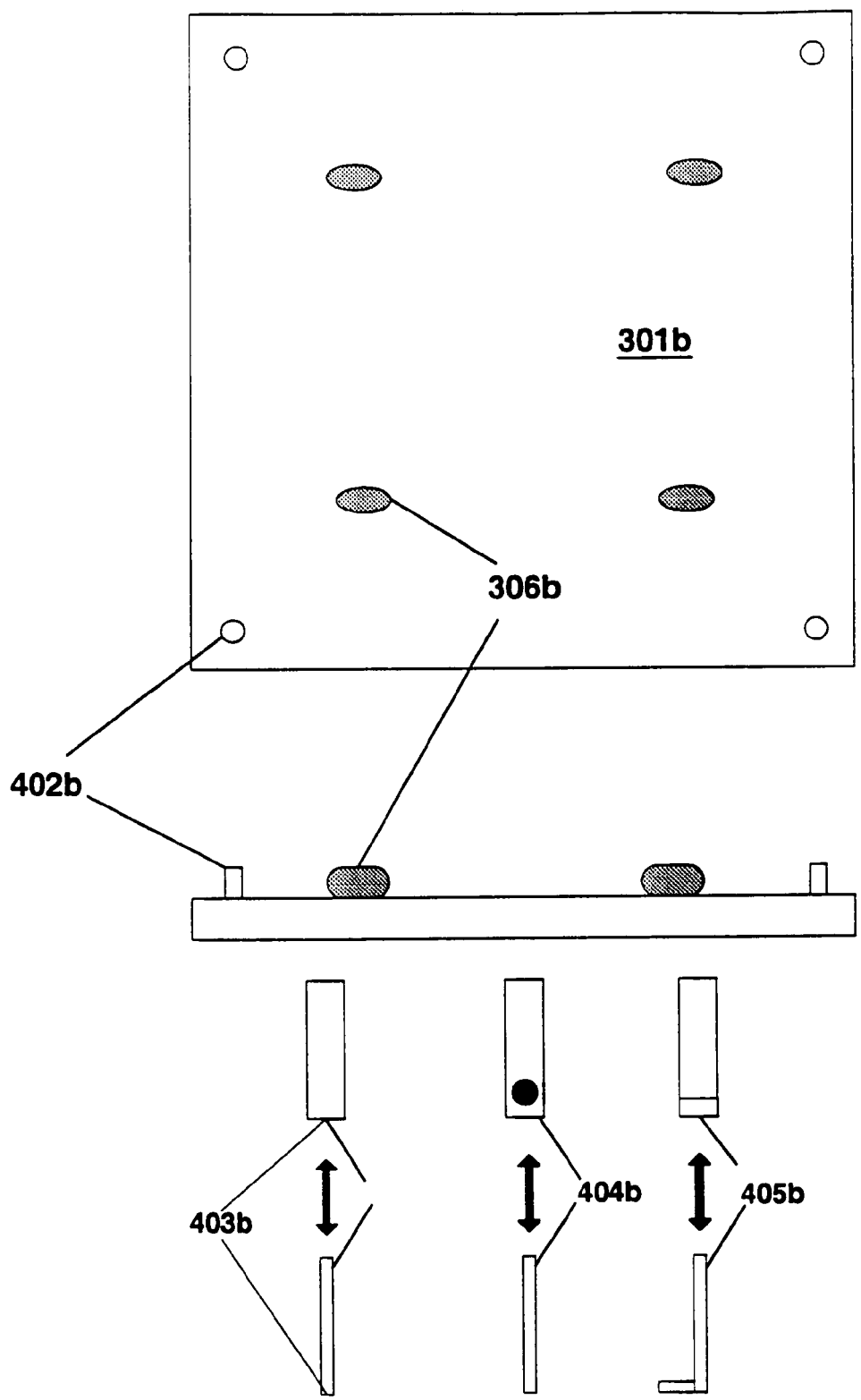
FIG. 4b shows an embodiment of a heat spreader with attached standoffs that uses alternative mechanical attachment structures.

Other types of structures that may be used as points of mechanical attachment for the sealant are illustrated in FIG. 4b. While not exclusive, examples include posts 402b, legs 403b, legs with holes 404b or legs with feet 405b. The structures function much like the reduced-size wall above, offering similar advantages for weight reduction and package flexibility. In one embodiment, the legs will be approximately 0.63 mm long. However, the physical dimensions of the structures discussed above may deviate substantially from those mentioned, and the above discussion should not be understood to limit the size or shape of the mechanical attachment structures.

Referring again to FIG. 4b, the legs 402 may be constructed using a variety of materials and methods. In one embodiment, they are constructed of a polymeric material. One example of such as a material is a high modulus epoxy. In another embodiment, another type of polymer or other material type, such as metal or ceramic, may be used. One method of manufacturing legs using polymeric material would be injection molding. However, there are a multitude of other methods that may be used for forming the legs, depending on the material used. These include, but are not limited to: Machining, liquid resin molding, thermoforming. In a different embodiment the legs may be formed as an integral part of the heat spreader, and may be created during the stamping process used to manufacture the part.

The legs 402b may be attached to the heat spreader 301b through a bonding process. Examples of bonding types may include attachment with an adhesive, such as an epoxy, or soldering. Depending on the type of material used for the legs and the type of bonding process, it may be necessary to roughen the surface of the heat spreader at the point of attachment, to increase the strength of the foot/heat spreader bond. Although there are a multitude of methods that can be used, examples of techniques used for roughening may include mechanical means, or through laser marking.

Figure 5:
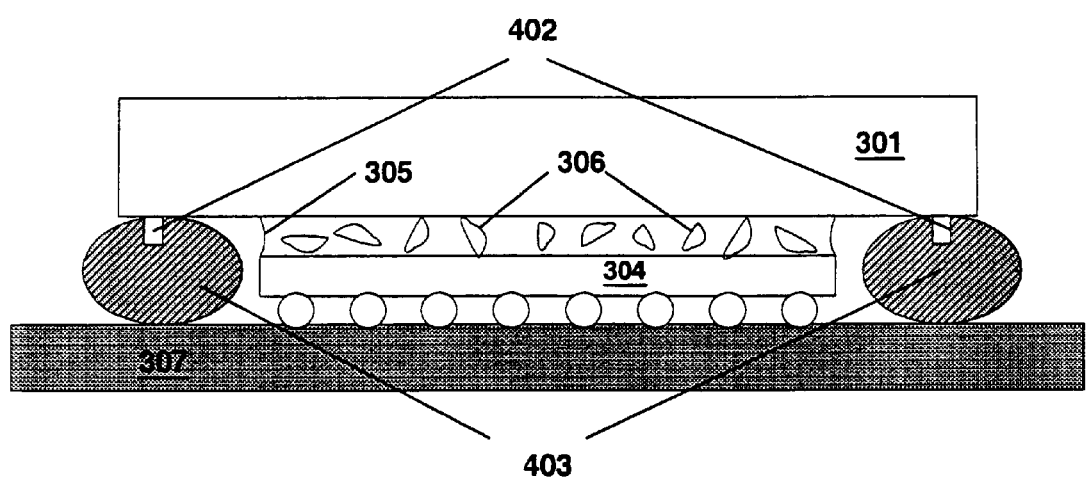
FIG. 5 shows a cross section of a package using an embodiment of a heat spreader with a reduced wall structure that does not have attached standoffs.

Note that the invention illustrated in FIG. 4 does not require the use of standoffs 406a on the heat spreader 401a. FIG. 5 illustrates another embodiment of the present invention, where bond line thickness 305 is controlled by metal particle 306 size of the thermal interface material between the heat spreader 301 and the integrated circuit 304, much like that of the prior art 204a. The embodiment shown in FIG. 5 may represent a less expensive alternative to the invention of FIG. 4 when particle size 507 can be tightly controlled.

Figure 6:
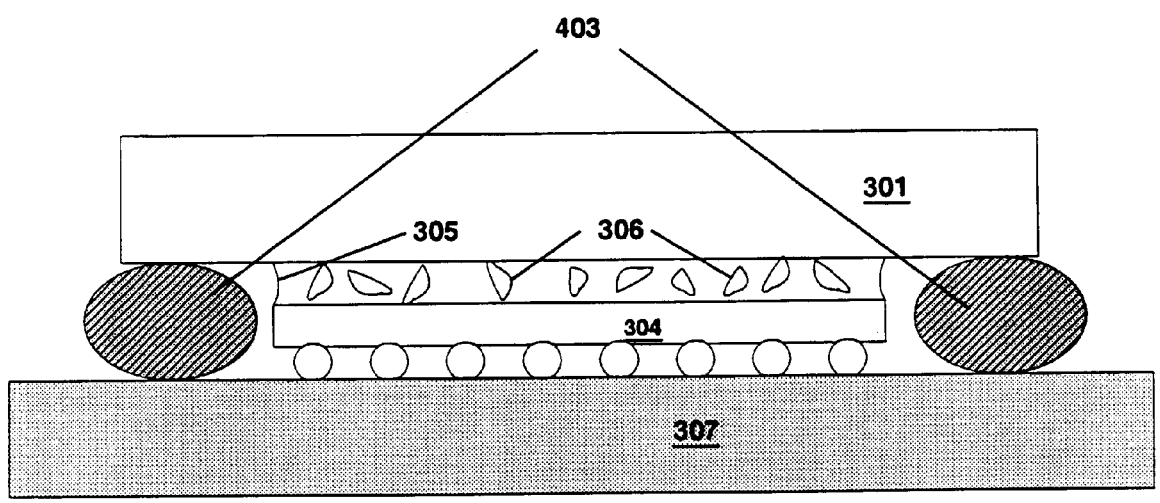
FIG. 6 shows a cross-section of a package using an embodiment of a heat spreader that has no wall structure or attached standoffs.

In another embodiment, shown in FIG. 6, there is no wall structure attached to the heat spreader 301 for mechanical attachment of the sealant material 403 used to form a contiguous seal between the heat spreader 301 and the substrate 307. This may have two advantages over the previous embodiments. First, elimination of the wall structure may result in a further decrease in package cost. Second, elimination of the wall structure may also result in the formation of a more flexible interface between the heat spreader 301 and the substrate 307, because the sealant material 403 is less constrained. This may result in a more reliable bond between when there is a mismatch in the coefficient of thermal expansion between the heat spreader 301 and the substrate 307.

Figure 7:
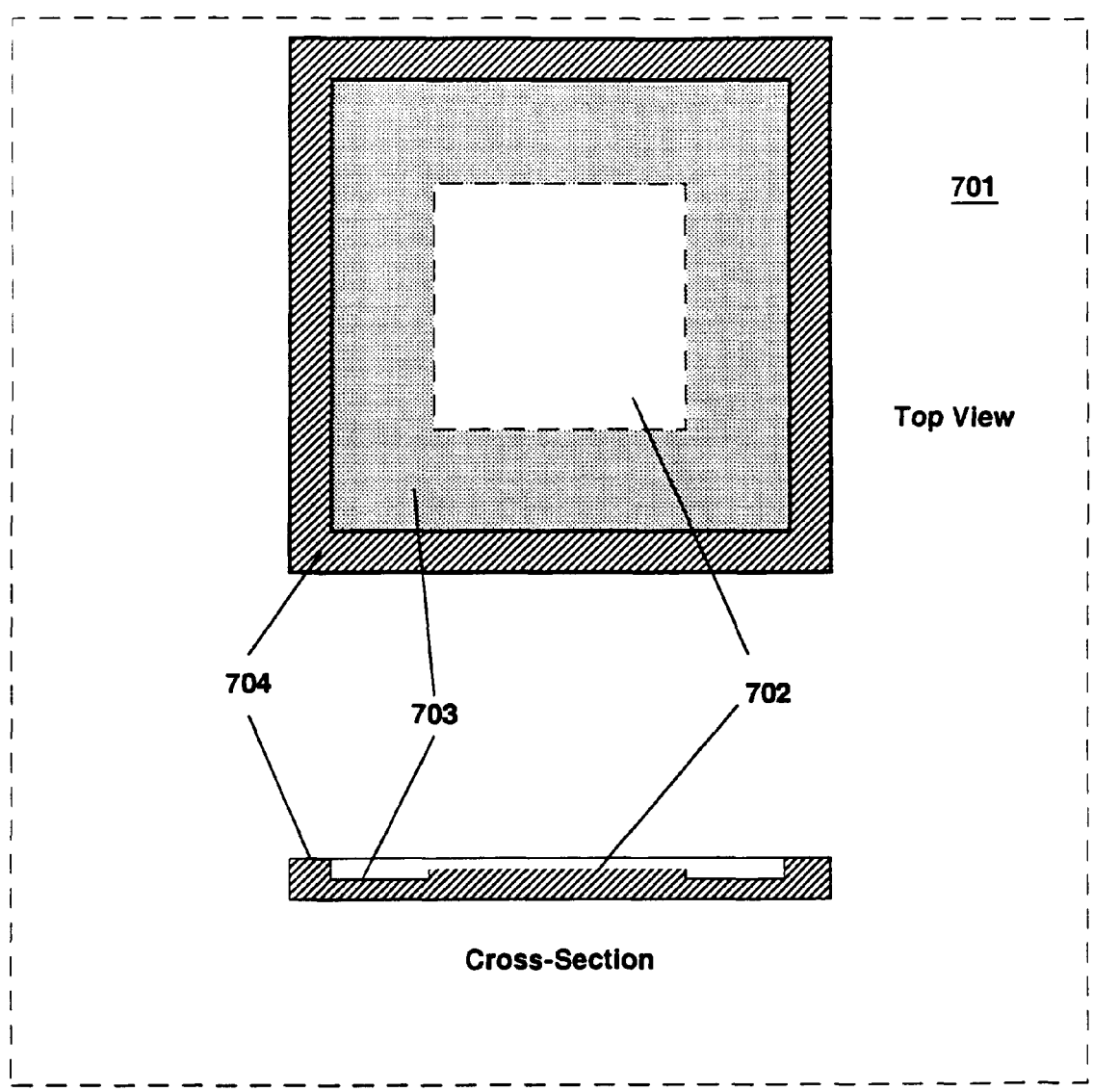
FIG. 7 shows a top view and a cross-section of an embodiment of a heat spreader incorporating a pedestal.
Figure 8:
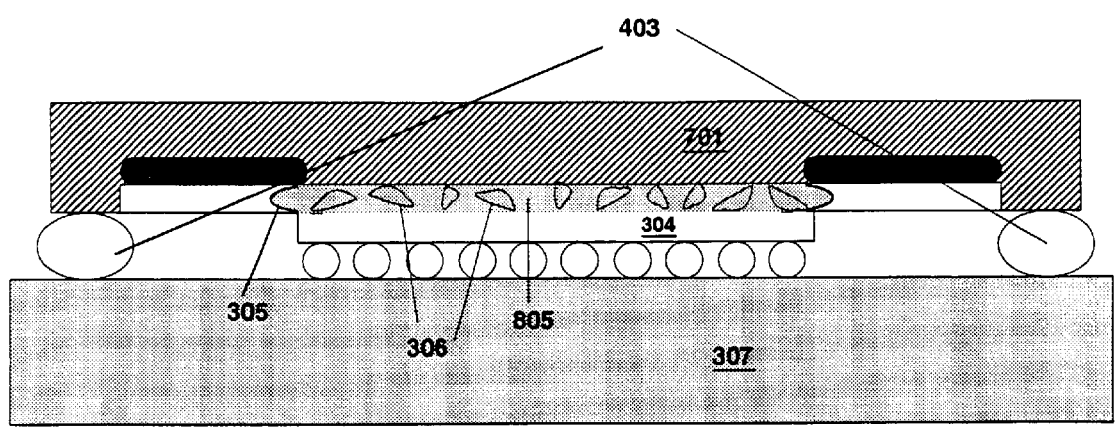
FIG. 8 shows a cross-section of an embodiment of an integrated circuit package using a heat spreader incorporating a pedestal.

FIGS. 7 and 8 illustrate a heat spreader designed to eliminate the problem of "pump out," which affects the thermal interface material (TIM) 305 in the integrated circuit/heat spreader interface. "Pump out" occurs when the package is exposed to thermal cycling. As the package temperature is cycled up and down the polymeric TIM matrix 805 starts to migrate away from the metal particles 306 that act as the heat conductor for the TIM. This leads to a phase separation between the particles 306 and the matrix 805, and eventually may cause void formation in the IC/heat spreader interface.

The present invention prevents "pump out" through the use of a built-in pedestal 702 in the center region of the heat spreader 701. The pedestal 702 is similar in size to the integrated circuit 304 that the pedestal 702 covers. When the heat spreader 701 is pressed into place above an integrated circuit 304 covered with a TIM 305, the TIM protrudes past the edge of the integrated circuit 305. In a typical heat spreader design, the polymer matrix 805 of the TIM is free to migrate as thermal cycling occurs. With the pedestal design, however, the recessed area 703 at the edge of the pedestal 702 prevents further migration of the TIM 305 out of the integrated circuit/heat spreader interface region. Because the polymer matrix 805 is constrained to the interface region, no phase separation should occur, and there should not be void formation in the interface. This should lead to improved package reliability, as well as improved thermal performance.

Figure 9:
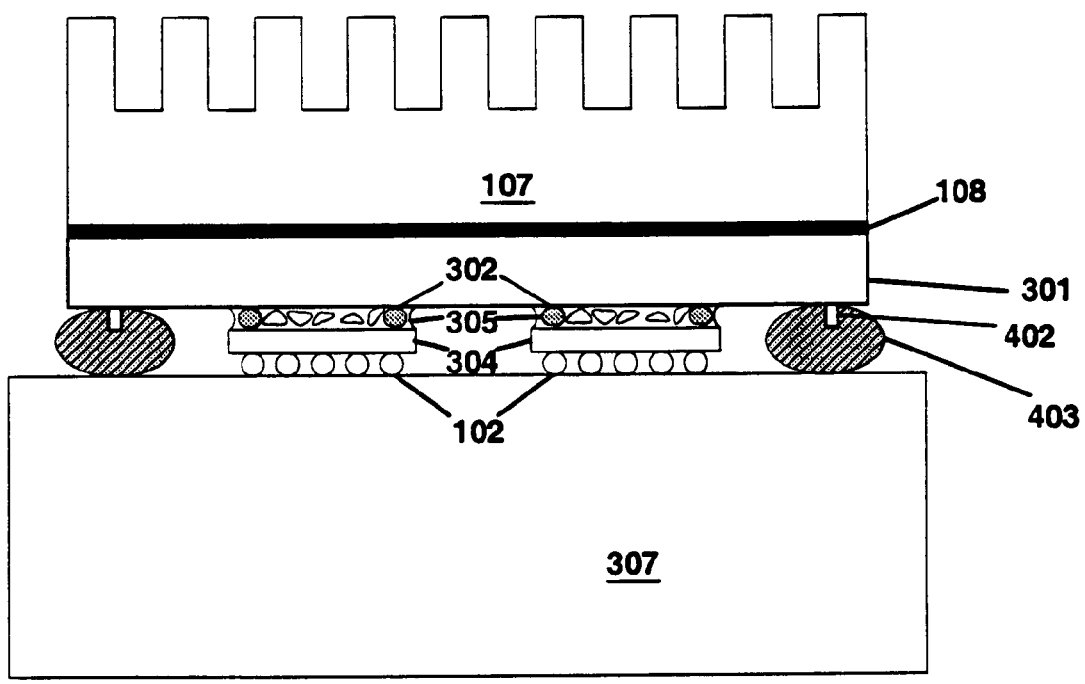
FIG. 9 shows an embodiment of an integrated circuit package incorporating a heat spreader with attached standoffs and a reduced lip that includes a plurality of integrated circuits.

Note that while the previous embodiments have focused on flip chip packages containing a single device, the present invention could also be used for packaging substrates with multiple integrated circuit devices attached. As shown in FIG. 9, these packages would have a configuration similar to that of a single chip package, containing multiple integrated circuits 304 attached to the substrate 307 through ball-grid arrays 102 and thermally coupled to the heat spreader 301 using a compliant heat-transfer medium 305. The bond thickness is controlled using a multitude of standoffs 302. The heat spreader 301 is coupled to the substrate using either a sealing material 403 alone or through a combination of sealing material 403 and reduced wall structure 402, as discussed in FIG. 4. The heat spreader will be further attached to a heat sink 107 using a heat transfer material 108 to facilitate the removal of heat from the heat spreader 301. All of the aforementioned embodiments with regard to heat spreader improvements could apply to the multi-chip configuration.

Thus, what has been described is an apparatus for spreading heat removed from the backside of a packaged semiconductor device. In the foregoing detailed description, the apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An apparatus, comprising:
   a heat spreader comprising heat conductive material and a contiguous wall structure extending from a surface of the heat spreader;
   a package substrate;
   a flexible material in contact with the surface of the heat spreader and the package substrate, the flexible material defining a perimeter of a cavity;
   a circuit substrate disposed within the cavity; and
   at least two stand-offs interdisposed between the surface of the heat spreader and the circuit substrate.

2. The apparatus of claim 1, wherein the flexible material comprises polymeric sealant material.

3. The apparatus of claim 1, wherein the heat spreader is plated with nickel.

4. The apparatus of claim 1, wherein the heat spreader is coated with a heat-conductive organic material.

5. The apparatus of claim 1 further comprising:
   a thermal interface material comprising metal particles disposed between a surface of the circuit substrate and the surface of the heat spreader.

6. A semiconductor package, comprising:
   a substrate having a surface;
   at least one semiconductor device coupled to the surface of the substrate;
   a cover coupled to the surface of the substrate through a flexible sealant material, the flexible material contacting a surface of the cover and the surface of the substrate and creating a space between the substrate and the cover, the semiconductor device residing within the space, and the cover comprised of a heat-conductive;
   at least two stand-offs interdisposed between the surface of the cover and the semiconductor device; and
   a thermal interface material comprising metal particles disposed between a surface of the semiconductor device and the surface of the cover,
   wherein the cover comprises a contiguous attachment structure extending from the surface into the flexible material.

7. The semiconductor package of claim 6, wherein the cover is a heat spreader.

* * * * *

UNITED STATES PATENT AND TRADEMARK OFFICE
CERTIFICATE OF CORRECTION

PATENT NO. : 7,190,585 B2 Page 1 of 1
APPLICATION NO. : 10/613418
DATED : March 13, 2007
INVENTOR(S) : Sabina J. Houle It is certified that error appears in the above-identified patent and that said Letters Patent is hereby corrected as shown below:

In column 8, at line 19, after "tive" insert --material--.

Signed and Sealed this

Eighth Day of April, 2008

JON W. DUDAS
*Director of the United States Patent and Trademark Office*